United States Patent
Gorman et al.

(10) Patent No.: US 6,858,334 B1
(45) Date of Patent: Feb. 22, 2005

(54) CERAMIC COMPOSITIONS FOR LOW CONDUCTIVITY THERMAL BARRIER COATINGS

(75) Inventors: Mark Daniel Gorman, West Chester, OH (US); Irene Spitsberg, Loveland, OH (US); Brett Allen Boutwell, Liberty Township, OH (US); Ramgopal Darolia, West Chester, OH (US); Robert William Bruce, Loveland, OH (US); Venkat Subramanian Venkataramani, Clifton Park, NY (US); Anthony Mark Thompson, Niskayuna, NY (US); Antonio Mogro-Campera, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/748,516

(22) Filed: Dec. 30, 2003

(51) Int. Cl.[7] .................... B32B 15/04; F03B 3/12; C23C 4/10; C23C 16/06
(52) U.S. Cl. .................... 428/701; 428/702; 428/699; 428/632; 428/633; 428/336; 416/241 B; 427/453; 427/596; 427/255.31
(58) Field of Search .................... 428/632, 633, 428/697, 699, 701, 702, 336; 416/241 B; 427/446, 453, 596, 255.31

(56) References Cited

U.S. PATENT DOCUMENTS

| | | | |
|---|---|---|---|
| 4,753,902 A | | 6/1988 | Ketcham |
| 4,886,768 A | * | 12/1989 | Tien .................... 501/104 |
| 5,104,832 A | * | 4/1992 | Michel et al. .............. 501/103 |
| 5,180,696 A | | 1/1993 | Inoue |
| 5,350,599 A | | 9/1994 | Rigney et al. |
| 5,384,200 A | | 1/1995 | Giles et al. |
| 5,705,231 A | | 1/1998 | Nissley et al. |
| 5,789,330 A | | 8/1998 | Kondo et al. |
| 5,824,089 A | | 10/1998 | Rieger |
| 5,942,334 A | | 8/1999 | Wortman |
| 5,981,088 A | | 11/1999 | Bruce et al. |
| 6,025,078 A | | 2/2000 | Rickerby et al. |

(List continued on next page.)

OTHER PUBLICATIONS

Hwang et al., "Grain Size Control of Tetragonal Zirconia Polycrystals Using the Space Charge Concept", J. Am. Ceram. Soc., 1990, 73(11):3269–77.

(List continued on next page.)

*Primary Examiner*—Jennifer McNeil
(74) *Attorney, Agent, or Firm*—Eric W. Guttag; Jagtiani & Guttag; David L. Narciso

(57) ABSTRACT

Zirconia-containing ceramic compositions having a c/a ratio of the zirconia lattice in the range of from about 1.005 to about 1.016. These compositions comprise a stabilizing amount up to about 10 mole % of the composition of a stabilizer component which comprises: (1) a first metal oxide selected from the group consisting of yttria, calcia, ceria, scandia, magnesia, india and mixtures thereof in an amount of from about 1.5 to about 6 mole % of the composition of; (2) a second metal oxide selected from the group consisting of lanthana, neodymia and mixtures thereof in an amount of from about 0.5 to about 4 mole % of the composition; and (3) optionally ytterbia in an amount of from about 0.5 to about 4 mole % of the composition. These compositions further comprise hafnia in an amount of from about 0.5 to about 15 mole % of the composition; and optionally tantala in an amount of from about 0.5 to about 1.5 mole % of the composition. These compositions are useful in preparing thermal barrier coatings having a balance of reduced thermal conductivity with good producibility, spallation resistance and erosion/impact resistance for an underlying substrate of articles that operate at, or are exposed to, high temperatures.

25 Claims, 3 Drawing Sheets

U.S. PATENT DOCUMENTS

| | | | |
|---|---|---|---|
| 6,054,184 | A | 4/2000 | Bruce et al. |
| 6,117,560 | A | 9/2000 | Maloney |
| 6,123,997 | A | 9/2000 | Schaeffer et al. |
| 6,183,884 | B1 | 2/2001 | Rickerby |
| 6,284,323 | B1 | 9/2001 | Maloney |
| 6,319,614 | B1 | 11/2001 | Beele |
| 6,333,118 | B1 | 12/2001 | Alperine et al. |
| 6,352,788 | B1 | 3/2002 | Bruce |
| 6,387,526 | B1 | 5/2002 | Beele |
| 6,395,381 | B1 | 5/2002 | Kondo et al. |
| 6,465,090 | B1 | 10/2002 | Stowell et al. |
| 2002/0172838 | A1 | 11/2002 | Rigney et al. |
| 2003/0049470 | A1 | 3/2003 | Maloney |
| 2003/0059633 | A1 | 3/2003 | Ackerman et al. |
| 2003/0224200 | A1 | 12/2003 | Bruce |

OTHER PUBLICATIONS

Kim, "Effect of $Ta_2O_5$, $Nb_2O_5$, and $HfO_2$ Alloying on the Transformability of $Y_2O_3$–Stabilized Tetragonal $ZrO_2$", J. Am. Ceram. Soc., 73(1):115–120.

Nakayama et al., "Effect of $La_2O_3$ Addition on Thermal Stability of Y–TZP," J. Mat. Sci. Lett., 18:1339–41 (1999).

Vassen et al., "Zirconates as New Materials for Thermal Barrier Coatings," J. Am. Ceram. Soc., 83(8):2023–28 (2000).

U.S. Appl. No. 10/748,517, filed Dec. 30, 2003, Boutwell et al.

U.S. Appl. No. 10/748,519, filed Dec. 30, 2003, Darolia et al.

U.S. Appl. No. 10/748,508, filed Dec. 30, 2003, Spitsberg et al.

U.S. Appl. No. 10/748,520, filed Dec. 30, 2003, Spitsberg et al.

U.S. Appl. No. 10/748,521, filed Dec. 30, 2003, Spitsberg et al.

U.S. Appl. No. 10/748,518, filed Dec. 30, 2003, Spitsberg et al.

U.S. Appl. No. 10/748,513, filed Dec. 30, 2003, Spitsberg et al.

* cited by examiner

CERAMIC COMPOSITIONS FOR LOW CONDUCTIVITY THERMAL BARRIER COATINGS

STATEMENT REGARDING FEDERALLY SPONSORED RESEARCH

This invention was made with Government support under Contract No. N00019-96-C-0176 awarded by the JSF Program Office. The Government has certain rights to the invention.

BACKGROUND OF THE INVENTION

This invention relates to ceramic compositions for thermal barrier coatings comprising zirconia and a stabilizer component having a first metal oxide such as yttria, and lanthana and/or neodymia as a second metal oxide, with or without ytterbia, for reduced thermal conductivity. This invention also relates to ceramic compositions comprising zirconia and a stabilizer component having a first metal oxide such as yttria and lanthana and/or neodymia as a second metal oxide, with or without ytterbia, that further include hafnia for reducing the conductivity of the resultant coating, and optionally tantala to contribute additional conductivity reductions. This invention further relates to coatings prepared from such compositions, articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coatings are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine airfoils such as blades and vanes, turbine shrouds, combustion liners, deflectors, and the like. These thermal barrier coatings typically comprise the external portion or surface of these components and are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

The thermal barrier coating is usually prepared from a ceramic material, such as a chemically (metal oxide) phase-stabilized zirconia. Examples of such chemically phase-stabilized zirconias include Yttria-stabilized zirconia, scandia-stabilized zirconia, ceria-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia. The thickness of the thermal barrier coating depends upon the metal substrate part or component it is deposited on, but is usually in the range of from about 3 to about 70 mils (from about 76 to about 1778 microns) thick for high temperature gas turbine engine parts.

There are a variety of ways to further reduce the thermal conductivity of such thermal barrier coatings. One is to increase the thickness of the coating. However, thicker thermal barrier coatings suffer from weight and cost concerns. Another approach is to reduce the inherent thermal conductivity of the coating. One effective way to do this is to provide a layered structure such as is found in thermal sprayed coatings, e.g., air plasma spraying coatings. However, coatings formed by physical vapor deposition (PVD), such as electron beam physical vapor deposition (EB-PVD), that have a columnar structure are typically more suitable for turbine airfoil applications (e.g., blades and vanes) to provide strain tolerant, as well as erosion and impact resistant coatings.

Another general approach is to make compositional changes to the zirconia-containing ceramic composition used to form the thermal barrier coating. A variety of theories guide these approaches, such as: (1) alloying the zirconia lattice with other metal oxides to introduce phonon scattering defects, or at higher concentration levels, to provide very complex crystal structures; (2) providing "coloring agents" that absorb radiated energy; and (3) controlling the porosity and morphology of the coating. All of these approaches have limitations. For example, modifying. the zirconia lattice, and in particular achieving a complex crystal structure, limits the options for chemical modification and can interfere with good spallation resistance and particle erosion resistance of the thermal barrier coating. Accordingly, a balanced approach for ceramic compositions used to prepare thermal barrier coatings is needed to reduce thermal conductivity, while at the same time achieving good producibility and good erosion/impact resistance.

BRIEF DESCRIPTION OF THE INVENTION

An embodiment of this invention relates to zirconia-containing ceramic compositions for preparing a thermal barrier coating for an underlying metal substrate of articles that operate at, or are exposed to, high temperatures. These compositions have a c/a ratio of the zirconia lattice in the range of from about 1.005 to about 1.016 and comprise:

a. a stabilizing amount up to about 10 mole % of the composition of a stabilizer component, which comprises:
  1. a first metal oxide selected from the group consisting of yttria, calcia, ceria, scandia, magnesia, india and mixtures thereof in an amount of from about 1.5 to about 6 mole % of the composition;
  2. a second metal oxide selected from the group consisting of lanthana, neodymia and mixtures thereof in an amount of from about 0.5 to about 4 mole % of the composition; and
  3. optionally ytterbia in an amount of from about 0.5 to about 4 mole % of the composition;

b. hafnia in an amount of from about 0.5 to about 15 mole % of the composition; and c. optionally tantala in an amount of from about 0.5 to about 1.5 mole % of the composition.

Another embodiment of this invention relates to a thermally protected article. This protected article comprises:

A. a substrate;

B. optionally a bond coat layer adjacent to and overlaying the substrate; and

C. a thermal barrier coating (prepared from the previously described ceramic composition) adjacent to and overlaying the bond coat layer (or overlaying the metal substrate if the bond coat layer is absent).

Another embodiment of this invention relates to a method for preparing the thermal barrier coating on a substrate to provide a thermally protected article. This method comprises the steps of:

A. optionally forming a bond coat layer on the substrate; and

B. depositing on the bond coat layer (or on metal substrate in the absence of the bond coat layer) the ceramic composition previously described to form a thermal barrier coating.

The ceramic compositions of this invention provide several benefits when used to provide thermal barrier coatings for substrates, especially metal substrates, of articles exposed to high temperatures, such as turbine components. Thermal barrier coatings prepared from these ceramic compositions provide a balance of reduced or lower thermal conductivity, with good producibility and erosion/impact resistance. Optional inclusion of hafnia, or a mixture of hafnia with tantala, further balances the conductivity of the resultant coating without adversely affecting the erosion and impact resistance thereof.

DETAILED DESCRIPTION OF THE INVENTION

Figure 1:
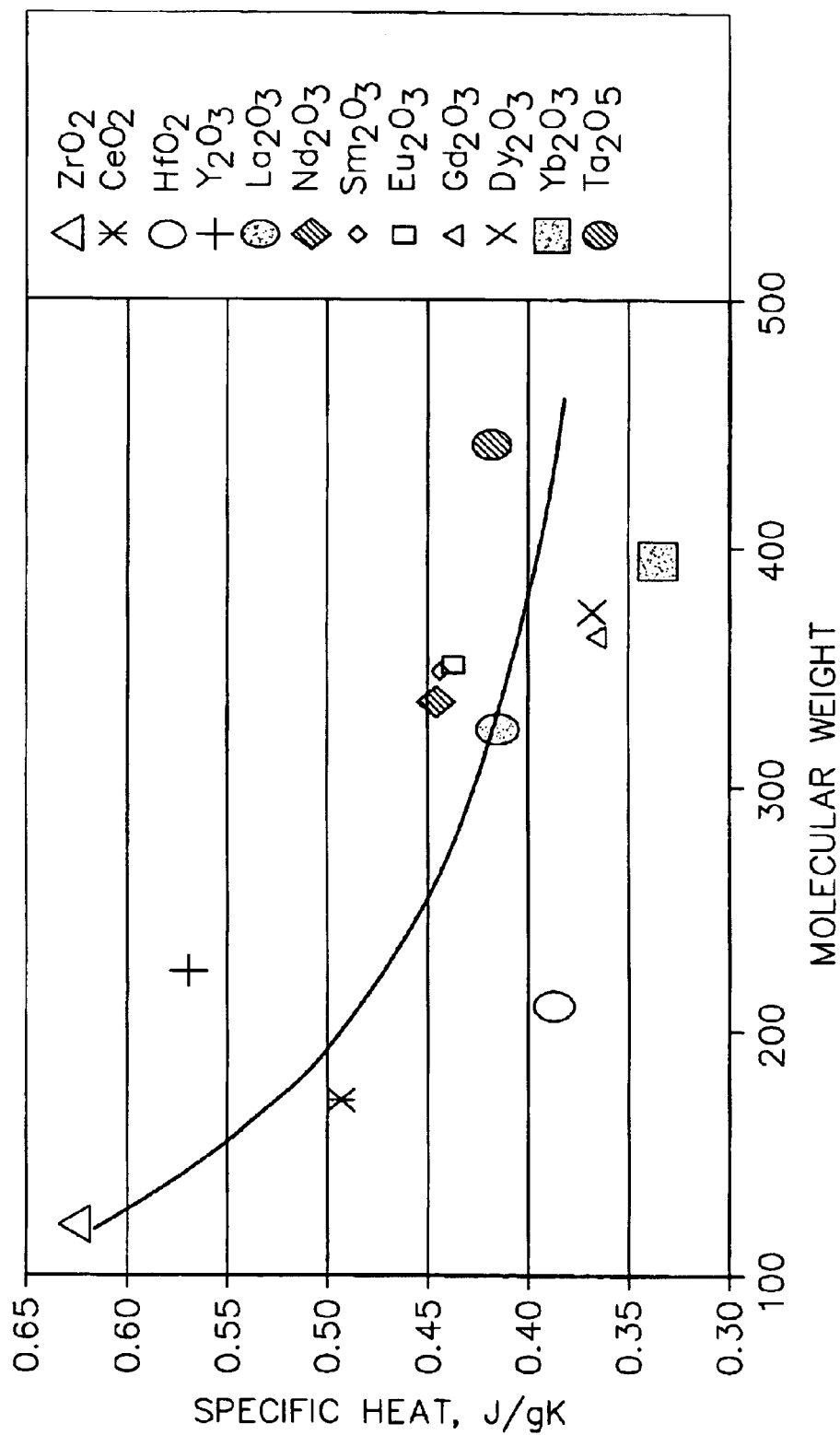
FIG. 1 represents a plot of specific heat ($C_p$) versus molecular weight for various metal oxides.

As used herein, the term "zirconia-containing ceramic compositions" refers to ceramic compositions where zirconia is the primary component that are useful as thermal barrier coatings that are capable of reducing heat flow to the underlying substrate of the article, i.e., forming a thermal barrier, and which have a melting point that is typically at least about 2600° F. (1426° C.), and more typically in the range of from about from about 3450° to about 4980° F. (from about 1900° to about 2750° C.).

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are by mole % unless otherwise specified.

The ceramic compositions of this invention impart improved thermal conductivity properties to the resulting thermal barrier coatings, and in particular lower thermal conductivity. Thermal conductivity is defined by the following equation (1):

$$K = \alpha \times (1-p) \times C_p \times D_t \qquad (1)$$

where $\alpha$ is the thermal diffusivity, p is the fraction of porosity, $C_p$ is the specific heat (in J/g*K), and $D_t$ is the theoretical density. As be seen from equation (1) above, thermal conductivity depends on thermal diffusivity and porosity.

The zirconia-containing ceramic compositions of this invention usually comprise at least about 80 mole % zirconia. Typically, the compositions of this invention comprise from about 86 to about 97 mole % zirconia, more typically from about 88 to about 95 mole % zirconia.

The compositions of this invention further comprise a stabilizing amount up to about 10 mole % of a stabilizer component comprising a first metal oxide, a second metal oxide, and optionally ytterbia as third metal oxide. The particular amount of the stabilizer component that is "stabilizing" will depend on a variety of factors, including the thermal insulating properties desired, the ability to minimize or reduce sintering of the resultant coating, the particular amounts and types of the first, second and optional third metal oxides used and like factors. Typically, the stabilizer component comprises from about 3 to about 10 mole %, more typically from about from about 5 to about 8 mole %, of the composition.

The first metal oxide can be selected from the group consisting of yttria, calcia, ceria, scandia, magnesia, india and mixtures thereof. The particular amount of the first metal oxide will depend on a variety of factors, including the thermal insulating properties desired, the particular first metal oxide used, the amounts and types of first metal oxide used and like factors. Typically the first metal oxide comprises from about 1.5 to about 6 mole %, more typically from about 3 to about 5 mole %, of the composition. Ceramic compositions of this invention typically comprise yttria as the first metal oxide.

The ceramic compositions of this invention having reduced thermal conductivity properties are based on the discovery that, to achieve any further reduction in thermal conductivity beyond that provided by the first metal oxide, a different mechanism is used. This mechanism involves including in the stabilizer component of these ceramic compositions comprising zirconia certain dopant metal oxide(s) (i.e., a second metal oxide and optionally a third metal oxide). Inclusion of the second metal oxide and optionally the third metal oxide in the stabilizer component of these ceramic compositions imparts significant benefits to the resulting thermal barrier coating, including one or more of the following: (a) adding atoms of atomic weight higher than zirconium (especially ytterbium, hafnium and tantalum) and typically greater than the atomic weight of the metal atom of first metal oxide (e.g., yttrium) to introduce effective phonon scattering sites and reduce the specific beat of the coating; (b) adding atoms of ionic radius different from zirconium (especially lanthanum and neodymium) and typically with an ionic radius greater than that of the metal atom of first metal oxide (e.g., yttrium) such that the resultant lattice strain introduces phonon scattering sites (i.e., to reduce the phonon mean free path); (c) and adding metal oxides of different valence from zirconia (especially metal oxides of trivalent metal ions such as ytterbia, neodymia, lanthana and yttria and metal oxides of pentavalent metal ions such as tantala) to introduce oxygen defects at a controlled level, thus creating another phonon scattering mechanism.

Suitable second metal oxides can be selected from the group consisting of lanthana, neodymia, and mixtures thereof. The particular amount of second metal oxide(s) included will depend on a variety of factors, including the thermal insulating properties desired, the particular second metal oxide(s) used, the amounts and types of first metal oxides used and like factors. Typically the second metal oxide comprises from about 0.5 to about 4 mole % of the ceramic composition. Levels of second metal oxide of about 0.5 mole % or higher can provide significant reductions in conductivity of the thermal barrier coating, while levels about 4 mole % or lower do not interfere with obtaining a partially stabilized structure. More typically, the second metal oxide(s) comprises from about 1.5 to about 3 mole %, of the ceramic composition. Compositions of this invention typically comprise lanthana as the second metal oxide in an amount of from about 0.5 to about 2.5 mole %, more typically from about 0.8 to about 2 mole %, of the composition. Levels of lanthana of about 0.5 mole % or higher can provide significant reductions in conductivity of the thermal barrier coating, while levels about 2.5 mole % or lower avoid reduced impact and erosion resistance. The stabilizer component can also optionally, but desirably comprise ytterbia as the third metal oxide. When ytterbia is present, it is typically included in an amount of from about 0.5 to about 4 mole %, more typically from about 1.5 to about 3 mole %, of the composition.

The ceramic compositions of this invention also comprise hafnia and optionally tantala. Inclusion of hafnia increases the molecular weight and $C_p$ of the composition without significantly influencing its stability, thus effectively balancing the thermal conductivity when the zirconia lattice stability is fixed by the stabilizer metal oxides, i.e., the first, second and optionally third metal oxides. Hafnia is typically included in an amount of from about 0.5 to about 15 mole % of the composition. Levels of hafnia of about 0.5 mole % or higher can provide significant reductions in the conductivity of the thermal barrier coating, while levels about 15 mole % or lower avoid undesirable increases in the density of the thermal barrier coating. More typically, hafnia comprises from about 1.5 to about 5 mole % of the composition.

Optional inclusion of tantala provides oxygen interstitial defects and phonon scattering by mass difference, thus effectively influencing the stability level in the direction opposite that of the stabilizer metal oxides, while contributing a reduction or lowering of thermal conductivity of the thermal barrier coating. Tantala is typically included in an amount of from about 0.5 to about 1.5 moles %, more typically from about 0.5 to about 1 moles %, of the composition.

Figure 2:
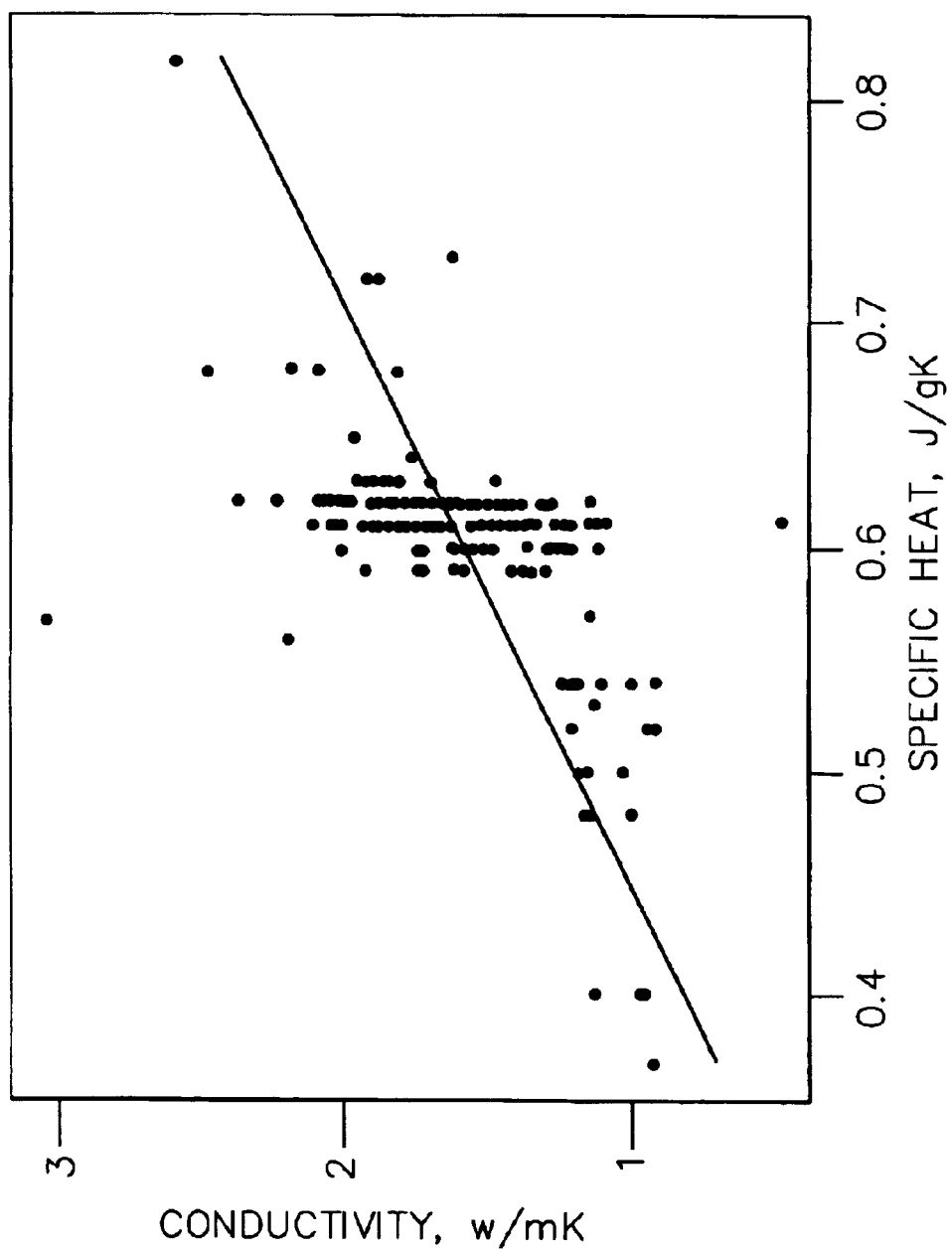
FIG. 2 represents a regression plot of conductivity versus specific heat for thermal barrier coatings prepared from various ceramic compositions.

The benefits from the inclusion of the second metal oxide(s), optionally with ytterbia, in the stabilizer metal oxide component, as well as the inclusion of hafnia, optionally with tantala, on the thermal conductivity of the thermal barrier coatings prepared from these zirconia-containing ceramic compositions is particularly shown in FIGS. 1 and 2. FIG. 1 represents a plot of specific heat ($C_p$) versus molecular weight of various metal oxides, including yttria, lanthana, ytterbia, hafnia and tantala. As shown in FIG. 1, several of the metal oxides, such as ytterbia and hafnia, fall below the specific heat trendline, and thus can provide desirable reductions in conductivity for zirconia-containing thermal barrier coatings beyond their expected effect on density. FIG. 1 shows that tantala can also provide a desirable reduction in conductivity in such coatings. FIG. 2 represents a regression plot of conductivity versus specific heat for thermal barrier coatings prepared from various ceramic compositions, including those containing as ytterbia, hafnia and tantala. The results in FIG. 2 are consistent with equation (1) above and show the conductivity reduction achieved in zirconia-containing thermal barrier coatings by including heavier metal oxides, such as ytterbia, hafnia and tantala.

The balance of metal oxides, especially the stabilizer metal oxides, in these zirconia-containing ceramic compositions is such that the resulting thermal barrier coating can be stabilized in the tetragonal phase so as to impart suitable spallation resistance, as well as impact and erosion resistance properties, to the coating. The tetragonal lattice stability equivalent for zirconia-containing ceramic compositions of this invention can be calculated based on the ratio of the zirconia lattice parameters c and a using equation (2) below:

$$\frac{c}{a} = k_1 \sum_i (r_i - r_{Zr}) \times m_i + k_2 \sum_i (V_i - V_{Zr}) \times m_i \qquad (2)$$

wherein c,a are the zirconia tetragonal lattice parameters, $r_i$ is the ionic radius of the metal oxide, $V_i$ is the valence of the metal ion of the metal oxide added, $m_i$ is the mole fraction of the metal oxide added and $k_1$ and $k_2$ are constants. See Kim, "Effect of $Ta_2O_5$, $Nb_2O_5$, and $HfO_2$ Alloying on the Transformability of $Y_2O_3$-Stabilized Tetragonal $ZrO_2$," J. Am. Ceram. Soc., (1990) L3(1):115–120. The zirconia-containing ceramic compositions of this invention that provide thermal barrier coatings with a balance of reduced thermal conductivity, spallation resistance and impact and erosion resistance have c/a ratios typically in the range of from about 1.005 to about 1.016, more typically in the range of from about 1.007 to about 1.013.

Thermal barrier coatings prepared from the ceramic compositions of this invention are useful with a wide variety of turbine engine (e.g., gas turbine engine) parts and components that are formed from a substrate, typically metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, combustor components such as liners and deflectors, augmentor hardware of gas turbine engines and the like. The thermal barrier coatings of this invention can also cover a portion or all of the metal substrate. For example, with regard to airfoils such as blades, the thermal barrier coatings of this invention are typically used to protect, cover or overlay portions of the metal substrate of the airfoil rather than the entire component, e.g., the thermal barrier coatings cover the leading and trailing edges and other surfaces of the airfoil, but not the attachment area. While the following discussion of the thermal barrier coatings of this invention will be with reference to metal substrates of turbine engine parts and components, it should also be understood that the thermal barrier coatings of this invention are useful with metal substrates of other articles that operate at, or are exposed to, high temperatures.

Figure 3:
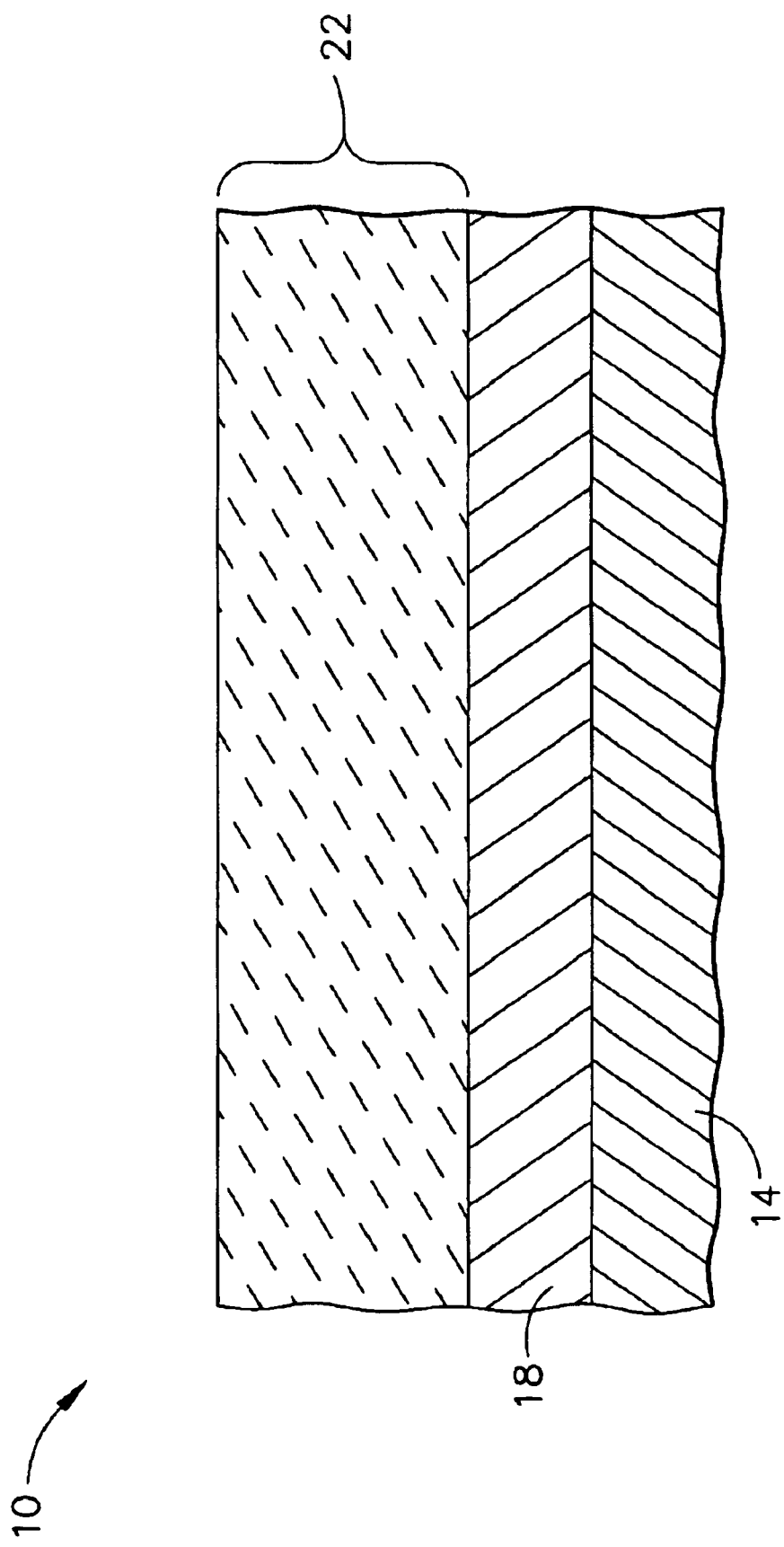
FIG. 3 is a partial side sectional view of an embodiment of the thermal barrier coating and coated article of this invention.

The various embodiments of the thermal barrier coatings of this invention are further illustrated by reference to the drawings as described hereafter. Referring to the drawings, FIG. 3 shows a partial side sectional view of an embodiment of the thermal barrier coating used with the metal substrate of an article indicated generally as 10. As shown in FIG. 3, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417–479 (1980), and Vol. 15, pp. 787–800 (1981). Illustrative high temperature nickel-based alloys are designated by the trade names Inconel®, Nimonic®, Rene® (e.g., Rene® 80, Rene® N5 alloys), and Udimet®. As described above, the type of substrate 14 can vary widely, but it is representatively in the form of a turbine part or component, such as an airfoil (e.g., blade) or turbine shroud.

As shown in FIG. 3, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, or NiAl(Zr) compositions, as well as various noble metal diffusion aluminides such as platinum aluminide, as well as simple aluminides (i.e., those formed without noble metals). This bond coat layer 18 can be applied, deposited or otherwise formed on substrate 10 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and U.S. Pat. No. 6,039,810 (Mantkowski et al), issued Mar. 21, 2000, all of which are incorporated by reference and which disclose various apparatus and methods for applying diffusion aluminide coatings, or combinations of such techniques, such as, for example, a combination of plasma spray and diffusion aluminide techniques. Typically, plasma spray or diffusion techniques are employed to deposit bond coat layer 18. Usually, the deposited bond coat layer 18 has a thickness in the range of from about 1 to about 20 mils (from about 25 to about 508 microns). For bond coat layers 18 deposited by PVD techniques such as EB-PVD or diffusion aluminide processes, the thickness is more typically in the range of from about 1 to about 4 mils (from about 25 to about 102 microns). For bond coat layers deposited by plasma spray techniques such as APS, the thickness is more typically in the range of from about 3 to about 15 mils (from about 76 to about 381 microns).

As shown in FIG. 3, thermal barrier coating (TBC) 22 prepared from the ceramic composition of this invention is adjacent to and overlies bond coat layer 18. The thickness of TBC 22 is typically in the range of from about 1 to about 100 mils (from about 25 to about 2540 microns) and will depend upon a variety of factors, including the article 10 that is involved. For example, for turbine shrouds, TBC 22 is typically thicker and is usually in the range of from about 30 to about 70 mils (from about 762 to about 1778 microns), more typically from about 40 to about 60 mils (from about 1016 to about 1524 microns). By contrast, in the case of turbine blades, TBC 22 is typically thinner and is usually in the range of from about 1 to about 30 mils (from about 25 to about 762 microns), more typically from about 3 to about 20 mils (from about 76 to about 508 microns).

In forming TBCs 22, the ceramic compositions of this invention can be applied, deposited or otherwise formed on bond coat layer 18 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray; chemical vapor deposition (CVD), or combinations of plasma spray and CVD techniques. The particular technique used for applying, depositing or otherwise forming TBC 22 will typically depend on the composition of TBC 22, its thickness and especially the physical structure desired for TBC 22. For example, PVD techniques tend to be useful in forming TBCs having a strain-tolerant columnar structure. By contrast, plasma spray techniques (e.g., APS) tend to create a splat-layered porous structure. TBC 22 is typically formed from ceramic compositions of this invention by PVD, and especially EB-PVD techniques to provide a strain-tolerant columnar structure.

Various types of PVD and especially EB-PVD techniques well known to those skilled in the art can also be utilized to form TBCs 22 from the ceramic compositions of this invention. See, for example, U.S. Pat. No. 5,645,893 (Rickerby et al), issued Jul. 8, 1997 (especially col. 3, lines 36–63); U.S. Pat. No. 5,716,720 (Murphy), issued Feb. 10, 1998) (especially col. 5, lines 24–61); and U.S. Pat. No. 6,447,854 (Rigney et al), issued Sep. 10, 2002, which are all incorporated by reference. Suitable EB-PVD techniques for use herein typically involve a coating chamber with a gas (or gas mixture) that preferably includes oxygen and an inert gas, though an oxygen-free coating atmosphere can also be employed. The ceramic coating compositions are then evaporated with an electron beams focused on, for example, ingots of the ceramic coating compositions so as to produce a vapor of metal ions, oxygen ions and one or more metal oxides. The metal and oxygen ions and metal oxides recombine to form TBC 22 on the surface of metal substrate 14, or more typically on bond coat layer 18.

Various types of plasma-spray techniques well known to those skilled in the art can also be utilized to form TBCs 22 from the ceramic compositions of this invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The ceramic coating composition, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface, substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the ceramic coating composition particles flowing into the plasma plume (or plasma "jet") is another parameter which is usually controlled very closely.

Suitable plasma spray systems are described in, for example, U.S. Pat. No. 5,047,612 (Savkar et al) issued Sep.

10, 1991, which is incorporated by reference. Briefly, a typical plasma spray system includes a plasma gun anode which has a nozzle pointed in the direction of the deposit-surface of the substrate being coated. The plasma gun is often controlled automatically, e.g., by a robotic mechanism, which is capable of moving the gun in various patterns across the substrate surface. The plasma plume extends in an axial direction between the exit of the plasma gun anode and the substrate surface. Some sort of powder injection means is disposed at a predetermined, desired axial location between the anode and the substrate surface. In some embodiments of such systems, the powder injection means is spaced apart in a radial sense from the plasma plume region, and an injector tube for the powder material is situated in a position so that it can direct the powder into the plasma plume at a desired angle. The powder particles, entrained in a carrier gas, are propelled through the injector and into the plasma plume. The particles are then heated in the plasma and propelled toward the substrate. The particles melt, impact on the substrate, and quickly cool to form the thermal barrier coating.

EXAMPLES

The following illustrates embodiments of thermal barrier coatings of this invention:

Example 1

A Thermal Barrier Coating is Prepared by EB-PVD Techniques from the Following Ceramic Composition

TABLE 1

| Metal Oxide | Mole % | Wt. % |
| --- | --- | --- |
| Zirconia | 93.7 | 86.7 |
| Yttria | 1.5 | 2.5 |
| Lanthana | 0.5 | 1.5 |
| Ytterbia | 1.9 | 5.8 |
| Hafnia | 2.2 | 3.5 |

Example 2

A Thermal Barrier Coating is Prepared by EB-PVD Techniques from the Following Ceramic Composition

TABLE 2

| Metal Oxide | Mole % | Wt. % |
| --- | --- | --- |
| Zirconia | 92.2 | 85.0 |
| Yttria | 1.8 | 3.0 |
| Lanthana | 1.2 | 3.0 |
| Ytterbia | 1.0 | 3.0 |
| Hafnia | 3.8 | 6.0 |

While specific embodiments of this invention have been described, it will be apparent to those skilled in the art that various modifications thereto can be made without departing from the spirit and scope of this invention as defined in the appended claims.

What is claimed is:

1. A zirconia-containing ceramic composition having a c/a ratio of the zirconia lattice in the range of from about 1.005 to about 1.016, and which comprises:
    a. a stabilizing amount up to about 10 mole % of the composition of a stabilizer component, which comprises:
        1. a first metal oxide selected from the group consisting of yttria, calcia, ceria, scandia, magnesia, india and mixtures thereof in an amount of from about 1.5 to about 6 mole % of the composition;
        2. a second metal oxide selected from the group consisting of lanthana, neodymia and mixtures thereof in an amount of from about 0.5 to about 4 mole % of the composition; and
        3. optionally ytterbia in an amount of from about 0.5 to about 4 mole % of the composition;
    b. hafnia in an amount of from about 0.5 to about 15 mole % of the composition; and
    c. optionally tantala in an amount of from about 0.5 to about 1.5 mole % of the composition.
2. The composition of claim 1 which comprises at least about 80 mole % zirconia.
3. The composition of claim 2 which comprises from about 86 to about 97 mole % zirconia and from about 3 to about 10 mole % stabilizer component.
4. The composition of claim 3 wherein the first metal oxide is yttria in an amount of from about 1.5 to about 6 mole % of the composition.
5. The composition of claim 4 wherein the c/a ratio is in the range of from about 1.007 to about 1.013.
6. The composition of claim 4 wherein the second metal oxide is lanthana in an amount of from about 0.5 to about 2 mole % of the composition.
7. The composition of claim 4 which comprises hafnia in an amount of from about 1.5 to about 5 mole % of the composition.
8. The composition of claim 7 which comprises tantala in an amount of from about 0.5 to about 1 mole % of the composition.
9. A thermally protected article, which comprises:
    A. a substrate; and
    B. a zirconia-containing thermal barrier coating having a c/a ratio of the zirconia lattice in the range of from about 1.005 to about 1.016 that is stabilized in the tetragonal crystalline phase, and which comprises:
        1. a stabilizing amount up to about 10 mole % of the thermal barrier coating of a stabilizer component, which comprises:
            a. a first metal oxide selected from the group consisting of yttria, calcia, ceria, scandia, magnesia, india and mixtures thereof in an amount of from about 1.5 to about 6 mole % of the thermal barrier coating of;
            b. a second metal oxide selected from the group consisting of lanthana, neodymia and mixtures thereof in an amount of from about 0.5 to about 4 mole % of the thermal barrier coating; and
            c. optionally ytterbia in an amount of from about 0.5 to about 4 mole % of the thermal barrier coating;
        2. hafnia in an amount of from about 0.5 to about 15 mole % of the thermal barrier coating; and
        3. optionally tantala in an amount of from about 0.5 to about 1.5 mole % of the thermal barrier coating.
10. The article of claim 9 wherein the substrate is a metal substrate, wherein the article further comprises a bond coat layer adjacent to and overlaying the metal substrate and wherein the thermal barrier coating is adjacent to and overlies the bond coat layer.
11. The article of claim 9 wherein the thermal barrier coating has a thickness of from about 1 to about 100 mils.
12. The article of claim 11 wherein the thermal barrier coating has a strain-tolerant columnar structure.
13. The article of claim 12 wherein the thermal barrier coating comprises at least about 80 mole % zirconia.

14. The article of claim 13 wherein the thermal barrier coating comprises from about 86 to about 97 mole % zirconia and from about 3 to about 10 mole % stabilizer component.

15. The article of claim 14 wherein the first metal oxide is yttria in an amount of from about 1.5 to about 6 mole % of the thermal barrier coating.

16. The article of claim 15 wherein the thermal barrier coating has c/a ratio is in the range of from about 1.007 to about 1.013.

17. The article of claim 15 wherein the second metal oxide is lanthana in an amount of from about 0.5 to about 2 mole % of the composition.

18. The article of claim 15 wherein thermal barrier coating comprises hafnia is an amount of from about 1.5 to about 5 mole % of the thermal barrier coating.

19. The article of claim 18 wherein the thermal barrier coating comprises tantala in an amount of from about 0.5 to about 1 mole % of the thermal barrier coating.

20. The article of claim 13 which is a turbine engine component.

21. The article of claim 20 which is a turbine shroud and wherein the thermal barrier coating has a thickness of from about 30 to about 70 mils.

22. The article of claim 20 which is a turbine airfoil and wherein the thermal barrier coating has a thickness of from about 3 to about 15 mils.

23. A method for preparing a thermal barrier coating on an underlying substrate, the method comprising the step of:
   A. forming a thermal barrier coating over the substrate by depositing a zirconia-containing ceramic composition having a c/a ratio of the zirconia lattice in the range of from about 1.005 to about 1.016 so that the zirconia is stabilized in the tetragonal crystalline phase, the ceramic composition comprising:
   1. a stabilizing amount up to about 10 mole % of the composition of a stabilizer component, which comprises:
      a. a first metal oxide selected from the group consisting of yttria, calcia, ceria, scandia, magnesia, india and mixtures thereof in an amount of from about 1.5 to about 6 mole % of the composition of;
      b. a second metal oxide selected from the group consisting of lanthana, neodymia and mixtures thereof in an amount of from about 0.5 to about 4 mole % of the ceramic composition; and
      c. optionally ytterbia in an amount of from about 0.5 to about 4 mole % of the ceramic composition;
   2. hafnia in an amount of from about 0.5 to about 15 mole % of the ceramic composition; and
   3. optionally tantala in an amount of from about 0.5 to about 1.5 mole % of the ceramic composition.

24. The method of claim 23 wherein the substrate is a metal substrate, wherein a bond coat layer is adjacent to and overlies the metal substrate and wherein the thermal barrier coating is formed on the bond coat layer.

25. The method of claim 24 wherein the ceramic composition is deposited on the bond coat layer by physical vapor deposition to form a thermal barrier coating having a strain-tolerant columnar structure.

* * * * *

UNITED STATES PATENT AND TRADEMARK OFFICE
CERTIFICATE OF CORRECTION

PATENT NO.    : 6,858,334 B1
DATED         : February 22, 2005
INVENTOR(S)   : Gorman et al.

It is certified that error appears in the above-identified patent and that said Letters Patent is hereby corrected as shown below:

Column 1,
Line 54, the text "Yttria-stabilized" should be corrected to -- yttria-stabilized --

Column 2,
Line 22, at the text "For example, modifying. the", the "." should be deleted.

Column 3,
Line 55, after the words "Thermal conductivity", and before the words "is defined" the letter -- K -- should be inserted.

Column 4,
Line 14, after the words "more typically", the words "from about from about" should be deleted and replaced with the words -- from about --.
Line 43, after the words "reduce the specific", the word "beat" should be deleted and replaced with the word -- heat --.

Column 5,
Lines 36 and 37, the text "moles" should be corrected to -- mole --.

Column 6,
Line 15, the text "L3(1):115-120." should be corrected to -- 73(1):115-120. --.
Line 19, the text "cla" should be corrected to -- c/a --.

UNITED STATES PATENT AND TRADEMARK OFFICE
CERTIFICATE OF CORRECTION

PATENT NO. : 6,858,334 B1
DATED : February 22, 2005
INVENTOR(S) : Gorman et al.

It is certified that error appears in the above-identified patent and that said Letters Patent is hereby corrected as shown below:

<u>Column 8,</u>
Line 21, the text "(Murphy), issued Feb. 10, 1998)" should read -- (Murphy), issued Feb. 10, 1998 --.
Line 29, the text "beams" should be corrected to -- beam --.

Signed and Sealed this

Fourteenth Day of June, 2005

JON W. DUDAS
*Director of the United States Patent and Trademark Office*